United States Patent
Maejima

(10) Patent No.: US 8,149,611 B2
(45) Date of Patent: *Apr. 3, 2012

(54) NONVOLATILE SEMICONDUCTOR MEMORY DEVICE

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/021,398

(22) Filed: Feb. 4, 2011

(65) Prior Publication Data

US 2011/0128774 A1    Jun. 2, 2011

Related U.S. Application Data

(63) Continuation of application No. 12/409,666, filed on Mar. 24, 2009, now Pat. No. 7,898,840.

(30) Foreign Application Priority Data

Apr. 25, 2008    (JP) .................. 2008-114799

(51) Int. Cl.
    *G11C 11/00*    (2006.01)
(52) U.S. Cl. ............ 365/148; 365/189.06; 365/211
(58) Field of Classification Search ......... 365/148, 365/189.06, 211, 171, 189.09, 115, 163
See application file for complete search history.

(56) References Cited

U.S. PATENT DOCUMENTS

| | | | |
|---|---|---|---|
| 6,487,113 B1 * | 11/2002 | Park et al. | 365/163 |
| 7,149,103 B2 * | 12/2006 | Ahn | 365/148 |
| 7,778,065 B2 | 8/2010 | Lamorey et al. | |
| 7,898,859 B2 * | 3/2011 | Ghodsi | 365/185.11 |
| 7,916,516 B2 * | 3/2011 | Wei et al. | 365/148 |
| 2003/0002331 A1 * | 1/2003 | Park et al. | 365/163 |
| 2010/0110766 A1 | 5/2010 | Wei et al. | |

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A nonvolatile semiconductor memory device comprises a memory cell array including first and second mutually crossing lines and electrically erasable programmable memory cells arranged at intersections of the first and second lines, each memory cell containing a variable resistor operative to nonvolatilely store the resistance thereof as data and a first non-ohmic element operative to switch the variable resistor; and a clamp voltage generator circuit operative to generate a clamp voltage required for access to the memory cell and applied to the first and second lines. The clamp voltage generator circuit has a temperature compensation function of compensating for the temperature characteristic of the first non-ohmic element.

16 Claims, 17 Drawing Sheets

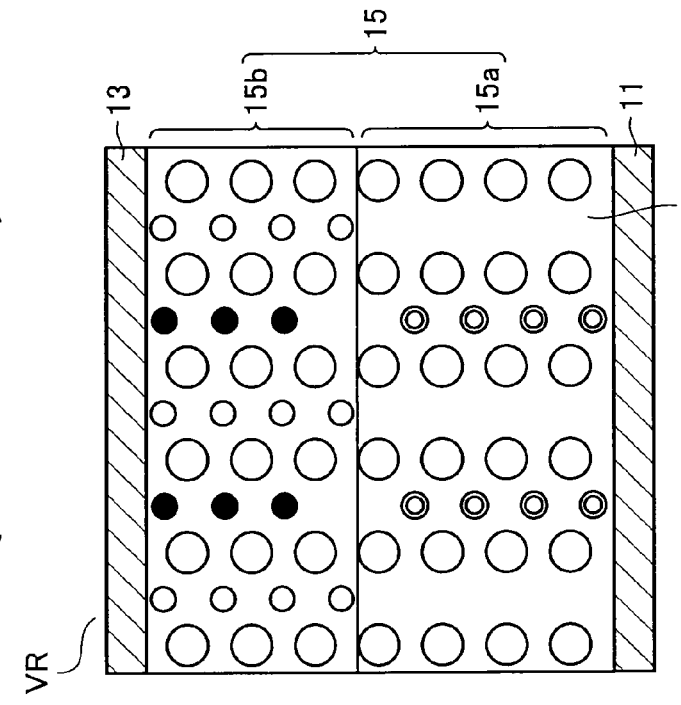
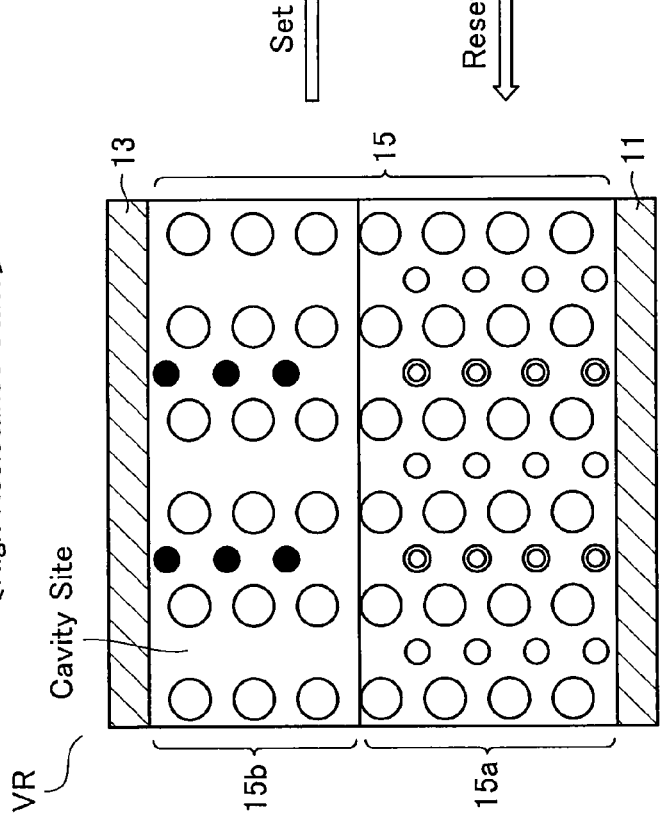
FIG. 5

FIG. 6
(a) Schottky Structure
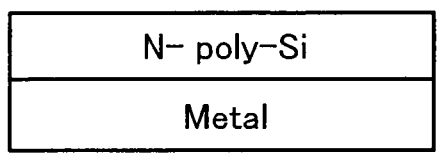
(d) MIM Structure
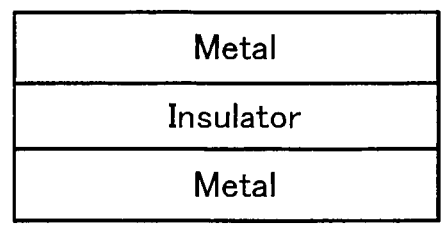
(b) PN Structure
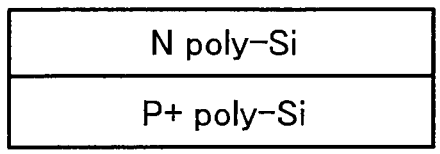
(e) SIS Structure
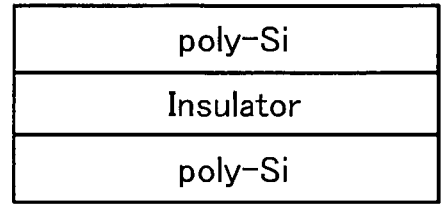
(c) PIN Structure
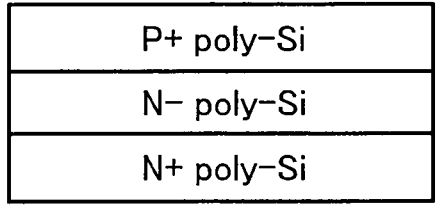

NONVOLATILE SEMICONDUCTOR MEMORY DEVICE

CROSS-REFERENCE TO RELATED APPLICATION

This application is a continuation of U.S. application Ser. No. 12/409,666 filed Mar. 24, 2009, and is based upon and claims the benefit of priority from the prior Japanese Patent Application No. 2008-114799, filed on Apr. 25, 2008, the entire contents of each of which are incorporated herein by reference.

BACKGROUND OF THE INVENTION

1. Field of the Invention

The present invention relates to a nonvolatile semiconductor memory device for nonvolatilely writing data in accordance with application of a voltage to a variable resistor.

2. Description of the Related Art

In recent years, attention has been focused on a nonvolatile memory comprising memory cells each containing a variable resistor, which are connected at intersections of word lines and bit lines and arranged in matrix.

Known examples of the nonvolatile memory of such the type include: a PCRAM (Phase-Change Random Access Memory) that uses a chalcogenide element as the variable resistor; a ReRAM (Resistance Random Access Memory) that uses a transition metal oxide element; and a CBRAM that changes the resistance by precipitating metal cations to form a bridge (conducting bridge) between electrodes and ionizing the precipitated metal to destruct the bridge. These resistance memories are characterized in that the variation in resistance is stored as information.

The PCRAM utilizes the shape, such as the magnitude and the width, of a current/voltage pulse applied to the chalcogenide element to control the process from heating to cooling, thereby causing a phase change between the crystalline state and the amorphous state to control the resistance of the element (see Patent Document 1: JP 2002-541613T). The ReRAM includes the bipolar type and the unipolar type. In the case of the bipolar type, the direction of the current/voltage pulse applied to the transition metal oxide element is used to control the resistance of the element. On the other hand, in the case of the unipolar type, the magnitude and the width of the current/voltage pulse applied to the transition metal oxide element are used to control the resistance of the element.

The unipolar type is preferable to realize a high-density memory cell array. This is because in the unipolar type a variable resistor and a rectifier such as a diode can be stacked at each cross-point of a bit line and a word line to configure a cell array with the use of no transistor. Such memory layers can be stacked to increase the memory capacity without increasing the area of the array. This is the purpose of a three-dimensional stacked resistance memory.

In the case of the ReRAM of the unipolar type, data can be programmed in a resistance memory by applying a program voltage of around 6.0 V to the variable resistor for around 10 ns, thereby changing the variable resistor from a high-resistance state to a low-resistance state. This state change is referred to as "program" or "set". When an erase voltage of around 2.0 V is applied to the data-programmed variable resistor and a flow of current of 1-10 μA is supplied for 200 ns to 1 μs, the variable resistor is changed from the low-resistance state to the high-resistance state. This state change is referred to as "erase" or "reset".

The resistance of such the variable resistor can be read out by applying a certain voltage to the variable resistor and sensing the value of current flowing in the variable resistor. Application of a voltage of 0.5 V to the variable resistor part requires application of a voltage, 0.5 V+Vf, to an actual bit line, which additionally includes a voltage Vf corresponding to the loss in the diode. This bit line voltage is generated by applying a clamp voltage to the gate of a clamp transistor in a sense amplifier circuit. The clamp voltage is generated from a bit line clamp voltage generator circuit.

The diode loss Vf has temperature dependence. Accordingly, if the clamp voltage and finally the bit line voltage have no temperature dependence, the voltage applied to the variable resistor part has temperature dependence instead. Therefore, even in the same variable resistor, the current flowing in the variable resistor part varies depending on the temperature and shifts the 1/0 decision point on sensing, which reduces the sense margin as a problem.

SUMMARY OF THE INVENTION

In an aspect the present invention provides a nonvolatile semiconductor memory device, comprising: a memory cell array including first and second mutually crossing lines and electrically erasable programmable memory cells arranged at intersections of the first and second lines, each memory cell containing a variable resistor operative to nonvolatilely store the resistance thereof as data and a first non-ohmic element operative to switch the variable resistor; and a clamp voltage generator circuit operative to generate a clamp voltage required for access to the memory cell and applied to the first and second lines. The clamp voltage generator circuit has a temperature compensation function of compensating for the temperature characteristic of the first non-ohmic element.

In another aspect the present invention provides a nonvolatile semiconductor memory device, comprising: a memory cell array including first and second mutually crossing lines and electrically erasable programmable memory cells arranged at intersections of the first and second lines, each memory cell containing a variable resistor operative to nonvolatilely store the resistance thereof as data and a first non-ohmic element operative to switch the variable resistor; a sense amplifier containing a clamp transistor operative to clamp a voltage required for access to the memory cell and applied to the first or second line; and a clamp voltage generator circuit operative to generate a clamp voltage to control the clamp transistor. The clamp voltage generator circuit includes a variable resistor circuit operative to set a voltage applied to the variable resistor on access to the memory cell, and a second non-ohmic element operative to compensate for the temperature characteristic of the first non-ohmic element.

In yet another aspect the present invention provides a nonvolatile semiconductor memory device, comprising: a memory cell array including first and second mutually crossing lines and electrically erasable programmable memory cells arranged at intersections of the first and second lines, each memory cell containing a variable resistor operative to nonvolatilely store the resistance thereof as data and a first non-ohmic element operative to switch the variable resistor; and a clamp voltage generator circuit operative to generate a clamp voltage required for access to the memory cell and applied to the first and second lines. The clamp voltage generator circuit has a temperature compensation function of compensating for the temperature characteristic of the non-ohmic element and is formed in the same layer as that of the memory cell accessible with the clamp voltage generation.

BRIEF DESCRIPTION OF THE DRAWINGS

FIG. 5 is a schematic cross-sectional view showing another variable resistor example in the same embodiment.

FIG. 6 is a schematic cross-sectional view showing a non-ohmic element example in the same embodiment.

DETAILED DESCRIPTION OF THE EMBODIMENTS

A first embodiment of the invention will now be described with reference to the drawings.

FIRST EMBODIMENT

Entire Configuration

Figure 1:
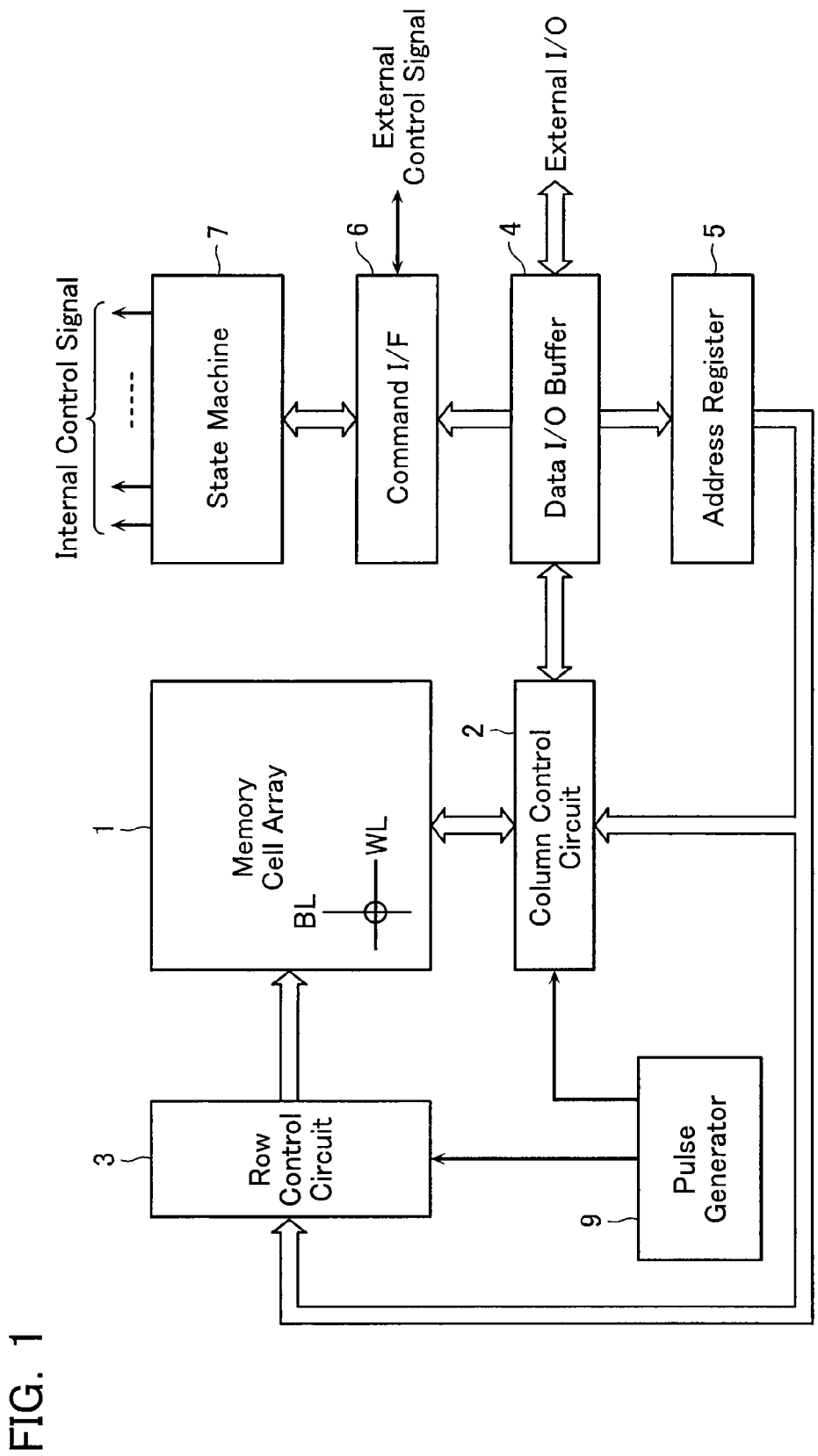
FIG. 1 is a block diagram of a nonvolatile semiconductor memory according to a first embodiment of the present invention.

FIG. 1 is a block diagram of a nonvolatile memory according to the first embodiment of the present invention.

The nonvolatile memory comprises a memory cell array 1 of memory cells arranged in matrix, including a later-described resistance memory device such as a PCRAM (Phase-Change RAM) and a ReRAM (Resistance RAM). A column control circuit 2 is provided on a position adjacent to the memory cell array 1 in the bit line BL direction. It controls the bit line BL in the memory cell array 1 to erase data from the memory cell, write data in the memory cell, and read data out of the memory cell. A row control circuit 3 is provided on a position adjacent to the memory cell array 1 in the word line WL direction. It selects the word line WL in the memory cell array 1 and applies voltages required to erase data from the memory cell, write data in the memory cell, and read data out of the memory cell. The column control circuit 2 and the row control circuit 3 configure a data read/write circuit for use in data read/write to the memory cell array 1.

A data I/O buffer 4 is connected to an external host device, not shown, to receive write data, receive erase instructions, provide read data, and receive address data and command data from/to the host device. The data I/O buffer 4 sends received write data to the column control circuit 2 and receives read-out data from the column control circuit 2 and provides it to external. An address fed from the external host device to the data I/O buffer 4 is sent via an address register 5 to the column control circuit 2 and the row control circuit 3. A command fed from the external host device to the data I/O buffer 4 is sent to a command interface 6. The command interface 6 receives an external control signal from external and decides whether the data fed to the data I/O buffer 4 is write data, a command or an address. If it is a command, then the command interface transfers it as a received command signal to a state machine 7. The state machine 7 manages the entire nonvolatile memory to receive commands from the external host device, read, write, erase, and execute data I/O management. The external host device can also receive status information managed by the state machine 7 and decide the operation result. The status information is also utilized in control of write and erase.

The state machine 7 controls the pulse generator 9. Under this control, the pulse generator 9 is allowed to provide a pulse of any voltage at any timing. The pulse formed herein can be transferred to any line selected by the column control circuit 2 and the row control circuit 3.

Peripheral circuit elements other than the memory cell array 1 can be formed in a Si substrate immediately beneath the memory array 1 formed in a wiring layer. Thus, the chip area of the nonvolatile memory can be made almost equal to the area of the memory cell array 1.

[Memory Cell Array and Peripheral Circuits]

Figure 2:
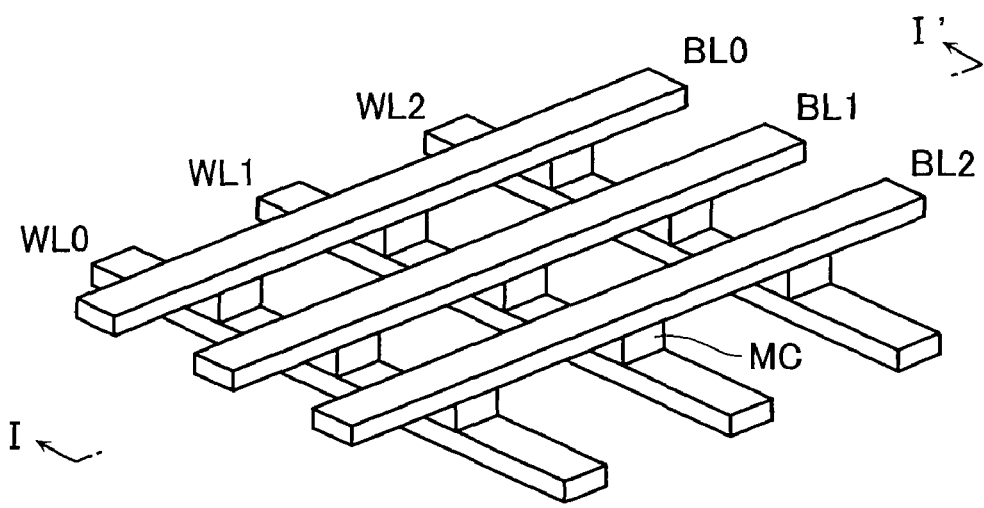
FIG. 2 is a perspective view of part of a memory cell array in the nonvolatile memory according to the same embodiment.
Figure 3:
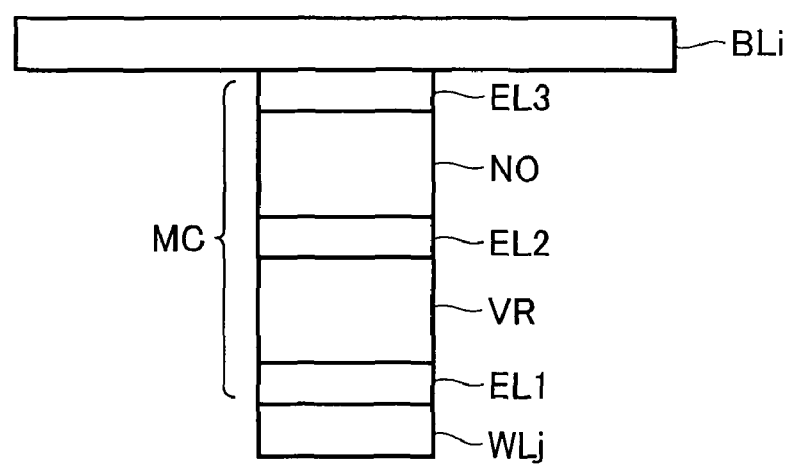
FIG. 3 is a cross-sectional view of one memory cell taken along I-I' line and seen from the direction of the arrow in FIG. 2.

FIG. 2 is a perspective view of part of the memory cell array 1, and FIG. 3 is a cross-sectional view of one memory cell taken along I-I' line and seen in the direction of the arrow in FIG. 2.

There are plural first lines or word lines WL0-WL2 disposed in parallel, which cross plural second lines or bit lines BL0-BL2 disposed in parallel. A memory cell MC is arranged at each intersection of both lines as sandwiched therebetween. Desirably, the first and second lines are composed of heat-resistive low-resistance material such as W, WSi, NiSi, CoSi.

The memory cell MC comprises a serial connection circuit of a variable resistor VR and a non-ohmic element NO as shown in FIG. 3.

The variable resistor VP can vary the resistance through current, heat, or chemical energy on voltage application. Arranged on an upper and a lower surface thereof are electrodes EL1, EL2 serving as a barrier metal layer and an adhesive layer. Material of the electrodes may include Pt, Au, Ag, TiAlN, SrRuO, Ru, RuN, Ir, Co, Ti, TiN, TaN, LaNiO, Al, PtIrOx, PtRhOx, Rh/TaAlN. A metal film capable of achieving uniform orientation may also be interposed. A buffer layer, a barrier metal layer and an adhesive layer may further be interposed.

Available examples of the variable resistor VR include: one that changes the resistance in accordance with a phase change between the crystalline state and the amorphous state, such as a chalcogenide (PCRAM); one that changes the resistance by precipitating metal cations to form a bridge (conducting bridge) between electrodes and ionizing the precipitated metal to destruct the bridge (CBRAM); and one that changes the resistance by applying a voltage or current (ReRAM) (which is roughly divided into two: one that causes a variation in resistance in accordance with the presence/absence of charge trapped in charge traps present in the electrode interface, and one that causes a variation in resistance in accordance with the presence/absence of the conduction path due to an oxygen loss and so forth).

Figure 4:
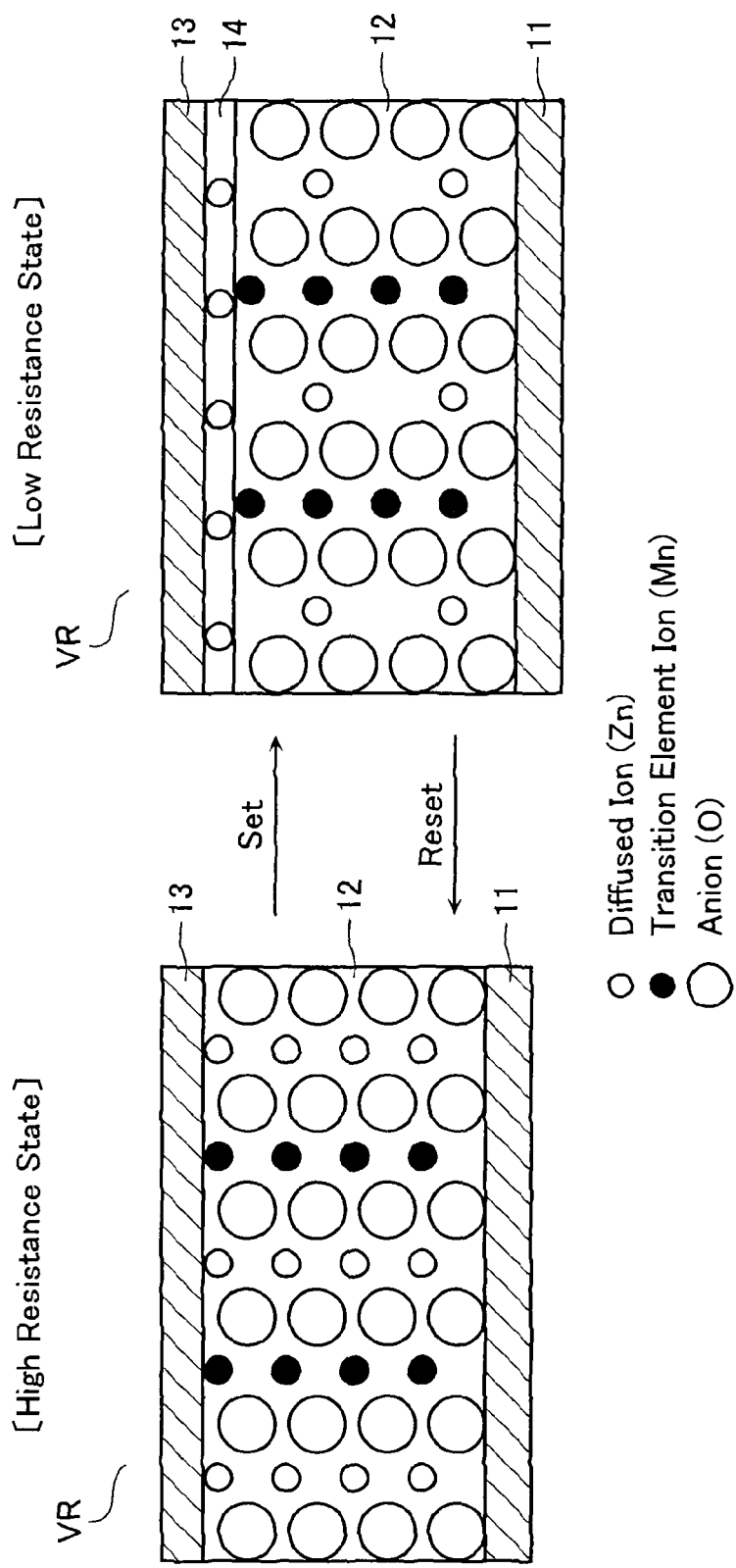
FIG. 4 is a schematic cross-sectional view showing a variable resistor example in the same embodiment.

FIGS. 4 and 5 show examples of the ReRAM. The variable resistor VR shown in FIG. 4 includes a recording layer 12 arranged between electrode layers 11, 13. The recording layer 12 is composed of a composite compound containing at least two types of cation elements. At least one of the cation elements is a transition element having the d-orbit incompletely filled with electrons, and the shortest distance between adjacent cation elements is 0.32 nm or lower. Specifically, it is represented by a chemical formula $A_xM_yX_z$ (A and M are different elements) and may be formed of material having a crystal structure such as a spinel structure ($AM_2O_4$), an ilmenite structure ($AMO_3$), a delafossite structure ($AMO_2$), a $LiMoN_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A comprises Zn, M comprises Mn, and X comprises O. In the recording layer 12, a small white circle represents a diffused ion (Zn), a large white circle represents an anion (O), and a small black circle represents a transition element ion (Mn). The initial state of the recording layer 12 is the high-resistance state. When the electrode layer 11 is kept at a fixed potential and a negative voltage is applied to the electrode layer 13, part of diffused ions in the recording layer 12 migrate toward the electrode layer 13 to reduce diffused ions in the recording layer 12 relative to anions. The diffused ions arrived at the electrode layer 13 accept electrons from the electrode layer 13 and precipitate as a metal, thereby forming a metal layer 14. Inside the recording layer 12, anions become excessive and consequently increase the valence of the transition element ion in the recording layer 12. As a result, the carrier injection brings the recording layer 12 into electron conduction and thus completes setting. On regeneration, a current may be allowed to flow, of which value is very small so that the material configuring the recording layer 12 causes no resistance variation. The programmed state (low-resistance state) may be reset to the initial state (high-resistance state) by supplying a large current flow in the recording layer 12 for sufficient time, which causes Joule heating to facilitate the oxidation reduction reaction in the recording layer 12. Application of an electric field in the opposite direction from that at the time of setting may also allow resetting.

In the example of FIG. 5, a recording layer 15 sandwiched between the electrode layers 11, 13 is formed of two layers: a first compound layer 15a and a second compound layer 15b. The first compound layer 15a is arranged on the side close to the electrode layer 11 and represented by a chemical formula $A_xM1_yX1_x$. The second compound layer 15b is arranged on the side close to the electrode layer 13 and has cavity sites capable of accommodating cation elements from the first compound layer 15a.

In the example of FIG. 5, A comprises Mg, M1 comprises Mn, and X1 comprises O in the first compound layer 15a. The second compound layer 15b contains Ti shown with black circles as transition element ions. In the first compound layer 15a, a small white circle represents a diffused ion (Mg), a large white circle represents an anion (O), and a double circle represents a transition element ion (Mn). The first compound layer 15a and the second compound layer 15b may be stacked in multiple layers such as two or more layers.

In such the variable resistor VR, potentials are given to the electrode layers 11, 13 so that the first compound layer 15a serves as an anode and the second compound layer 15b serves as a cathode to cause a potential gradient in the recording layer 15. In this case, part of diffused ions in the first compound layer 15a migrate through the crystal and enter the second compound layer 15b on the cathode side. The crystal of the second compound layer 15b includes cavity sites capable of accommodating diffused ions. Accordingly, the diffused ions moved from the first compound layer 15a are trapped in the cavity sites. Therefore, the valence of the transition element ion in the first compound layer 15a increases while the valence of the transition element ion in the second compound layer 15b decreases. In the initial state, the first and second compound layers 15a, 15b maybe in the high-resistance state. In such the case, migration of part of diffused ions in the first compound layer 15a therefrom into the second compound layer 15b generates conduction carriers in the crystals of the first and second compounds, and thus both have electric conduction. The programmed state (low-resistance state) maybe reset to the erased state (high-resistance state) by supplying a large current flow in the recording layer 15 for sufficient time for Joule heating to facilitate the oxidation reduction reaction in the recording layer 15, like in the preceding example. Application of an electric field in the opposite direction from that at the time of setting may also allow reset.

The non-ohmic element NO may include various diodes as shown in FIG. 6, for example, (a) a Schottky diode, (b) a PN-junction diode, (c) a PIN diode and may have (d) a MIM (Metal-Insulator-Metal) structure, and (e) a SIS (Silicon-Insulator-Silicon) structure. In this case, electrodes EL2, EL3 forming a barrier metal layer and an adhesive layer may be interposed. If a diode is used, from the property thereof, it can perform the unipolar operation. In the case of the MIM structure or SIS structure, it can perform the bipolar operation. The non-ohmic element NO and the variable resistor VR may be arranged upside-down compared with FIG. 3 and the polarity of the non-ohmic element NO may be inverted upside-down.

Figure 7:
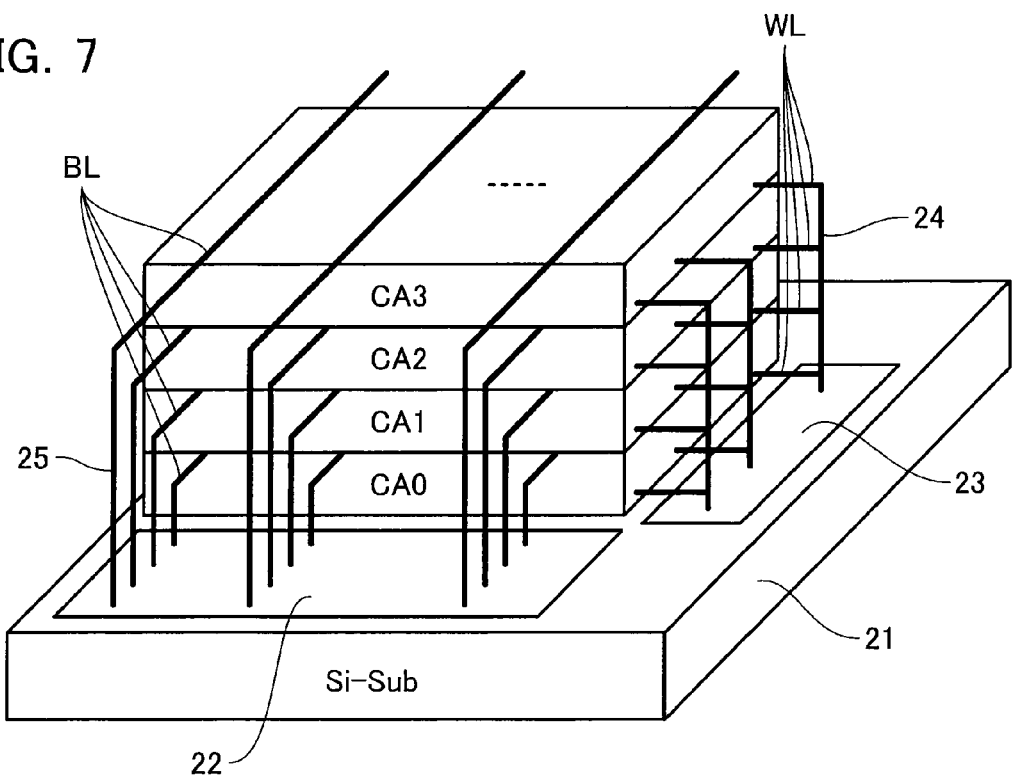
FIG. 7 is a perspective view of the memory cell array and peripheral circuits thereof according to the same embodiment.

Plural such memory structures described above may be stacked to form a three-dimensional structure as shown in FIG. 7, which shows an example of four-layered cell arrays CA0-CA3 stacked on a silicon substrate 21. Word lines WL in the cell arrays are commonly connected through via-lines 24 and connected to a row control circuit 23 on the substrate 21. Bit lines BL0-BL3 in the cell arrays CA0-CA3 are independently connected through respective via-lines 25 to a column control circuit 22 on the substrate 21.

Figure 8:
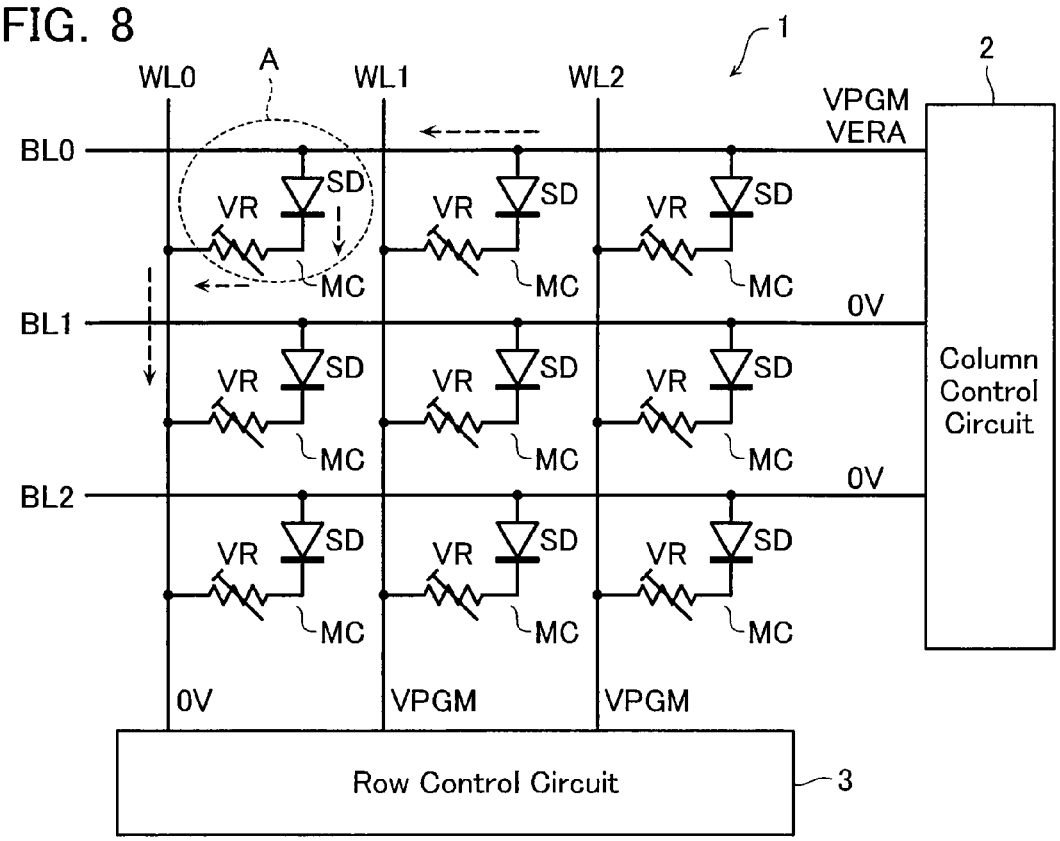
FIG. 8 is a circuit diagram of the memory cell array and peripheral circuits thereof according to the same embodiment.
Figure 9:
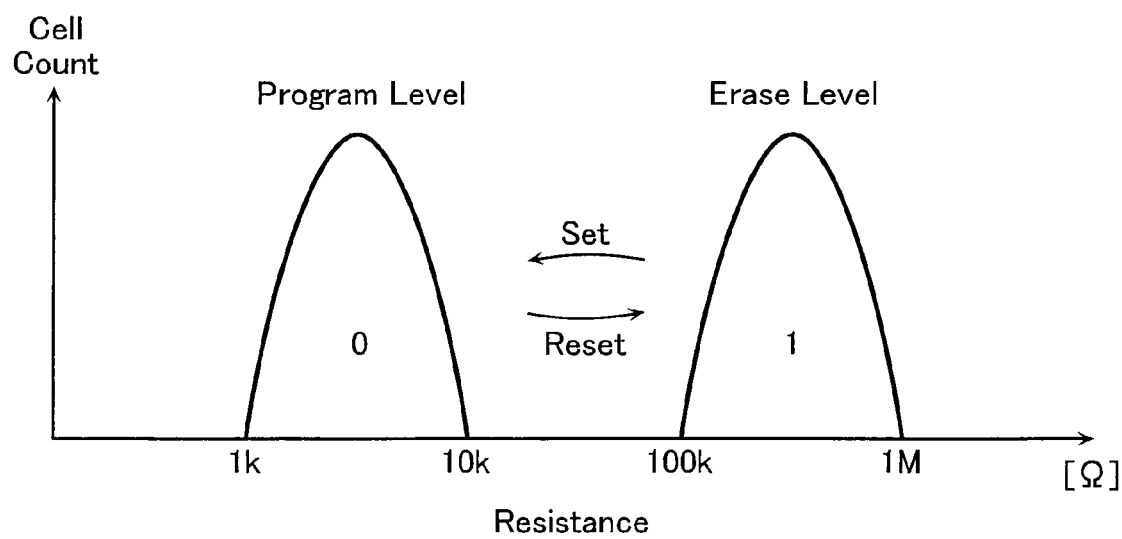
FIG. 9 is a graph showing a relation between resistance distributions and data among memory cells in the case of binary data.

FIG. 8 is an equivalent circuit diagram showing details of the memory cell array 1 of FIG. 1. A diode SD is herein used as the non-ohmic element NO and, for simplicity of description, it is assumed to have a single-layered structure to advance the description.

In FIG. 8, a memory cell MC in the memory cell array MA includes a diode SD and a variable resistor VR connected in series. The diode SD has an anode connected to a bit line BL and a cathode connected via the variable resistor VR to a word line WL. Each bit line BL has one end connected to the column control circuit 2. Each word line WL has one end connected to the row control circuit 3.

The memory cells MC may be selected individually. Alternatively, data in plural memory cells MC connected to the selected word line WL1 may be read out together in another mode. The memory cell array 1 may be configured such that current flows from the word line WL to the bit line BL with the inverted polarity of the diode SD compared to the circuit of FIG. 8.

[Operation of Nonvolatile Memory]

The following description is given to operation of the nonvolatile semiconductor memory thus configured.

In this example, a memory cell MC connected to a word line WL0 and a bit line BL0 is assumed as a selected cell A shown with a dotted circle in FIG. 8 and subjected to data erase and program. Data erase can be executed by resetting, that is, applying 0 V to the word line WL and an erase voltage VERA of, for example, around 2.0 V to the bit line BL0 to supply a current of 1-10 μA only for 200 ns to 1 μs. Data write (program) in the variable resistor VR can be executed by such processing as applying 0 V to the word line WL0 and a program voltage VPGM of, for example, around 6.0 V (with a current value of around 10 nA) to the bit line BL0 only for 10-100 ns to shift the resistance of the variable resistor VR into the low-resistance range. Data erase corresponds to "1"-data programming or resetting while data write corresponds to "0"-data programming or setting. The resistance of the variable resistor VR contained in the memory cell MC distributes over a high-resistance range of 100 kΩ to 1 MΩ in the erased state and over a low-resistance range of 1-10 kΩ in the written (programmed) state.

[Operation of Read/Write Circuit in ReRAM]

The following description is given to a specific read/write circuit in the ReRAM and operation thereof.

Figure 10:
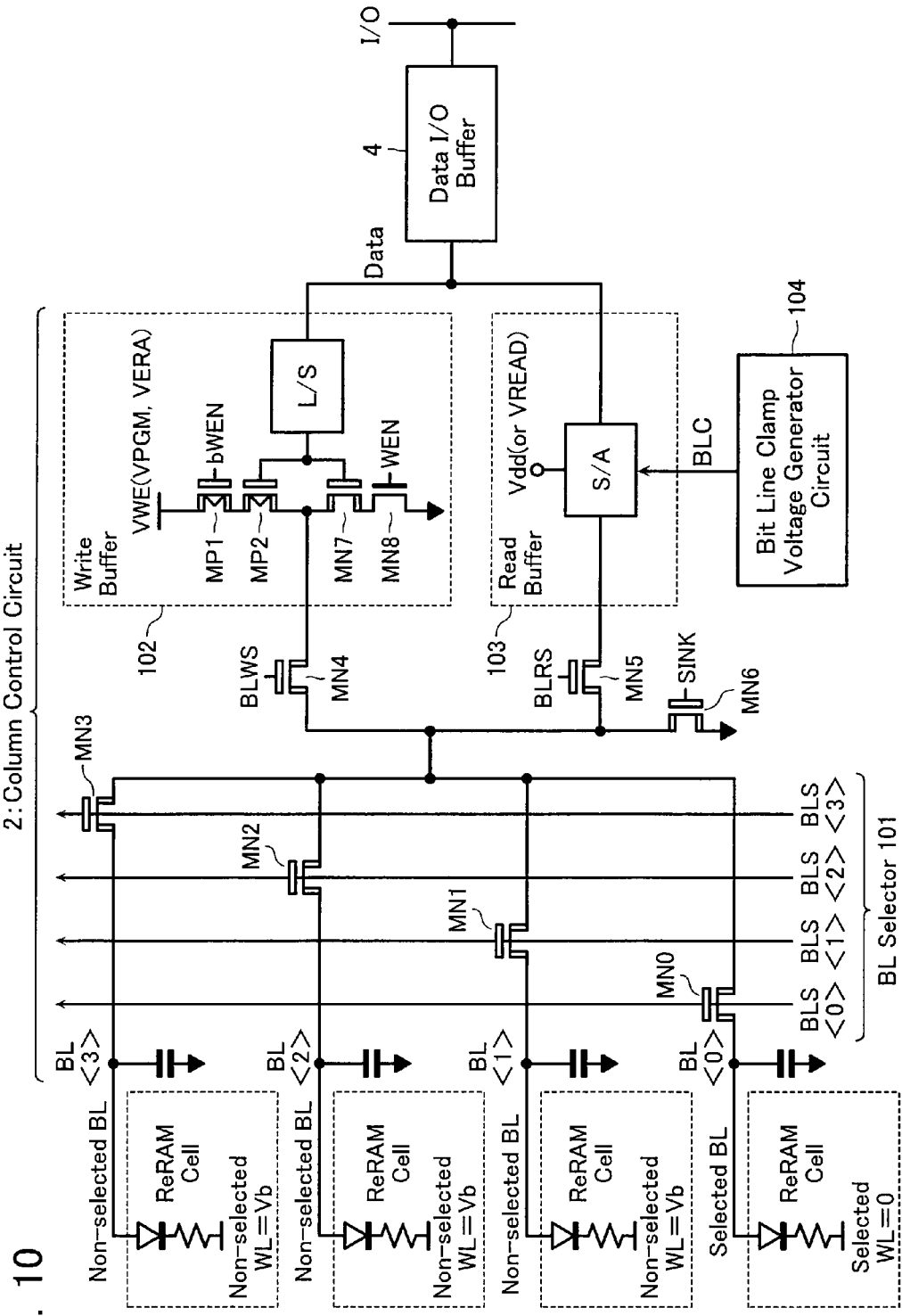
FIG. 10 is a circuit diagram showing a column control circuit and the periphery thereof according to the same embodiment.

FIG. 10 shows details of the column control circuit 2 contained in the read/write circuit. The column control circuit 2 includes a bit line selector 101, and a write buffer 102 and a read buffer 103 connected to a bit line selected by the selector. The write buffer 102 and the read buffer 103 are connected via a data I/O buffer 4 to data lines I/O.

A circuit exemplified as the bit line selector 101 herein includes four selection NMOS transistors MN0-MN3, which are driven by selection signals BLS<0>-<3> to select one of four bit lines BL<0>-<3>. The selection NMOS transistors MN0-MN3 are high-breakdown voltage transistors. When the bit line BL<0> is selected, the corresponding word line is kept at Vss (=0 V), and a blocking voltage Vb (corresponding to VPGM in FIG. 8) selected in accordance with write/read is applied to non-selected word lines.

In the case of the three-dimensional cell array described in FIG. 7, the bit line selector 101 requires cell array selection and bit line selection in the cell array and actually becomes very complicated though a configuration for simply selecting one of four bit lines is exemplified herein.

The bit line selected by the selector 101 is connected to the write buffer 102 when a switch NMOS transistor MN4 is turned on with a write selection signal BLWS, and to the read buffer 103 when a switch NMOS transistor MN5 is turned on with a read selection signal BLRS. These NMOS transistors MN4, MN5 are also high-breakdown voltage transistors.

The write buffer 102 includes a CMOS driver containing a PMOS transistor MP2 and an NMOS transistor MN7. The PMOS transistor MP2 is connected via an activation PMOS transistor MP1 to a voltage application node VWE, and the NMOS transistor MN7 is connected via an activation NMOS transistor NM8 to a ground node Vss. The CMOS driver has a common gate, which is given write data via a level shifter L/S.

Figure 11:
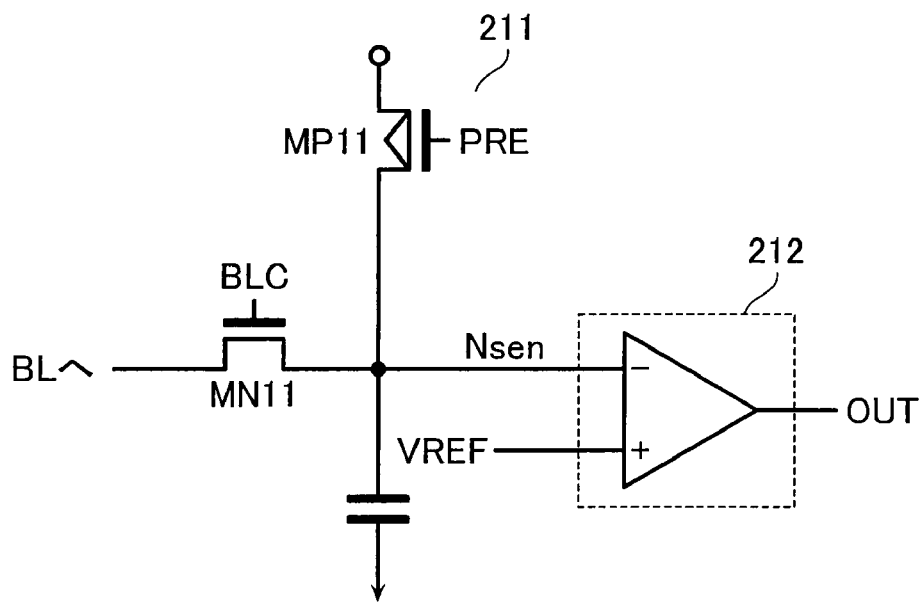
FIG. 11 is a circuit diagram showing a first configuration example of a sense amplifier in the column control circuit.
Figure 12:
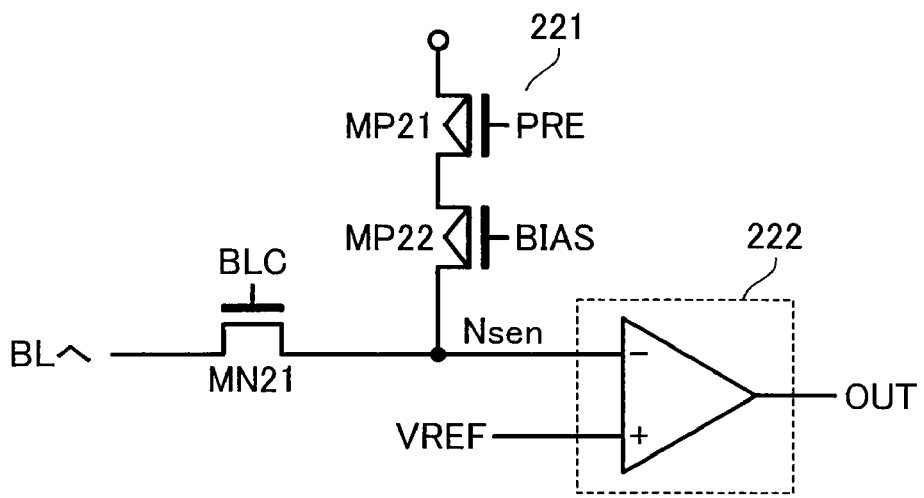
FIG. 12 is a circuit diagram showing a second configuration example of a sense amplifier in the column control circuit.
Figure 13:
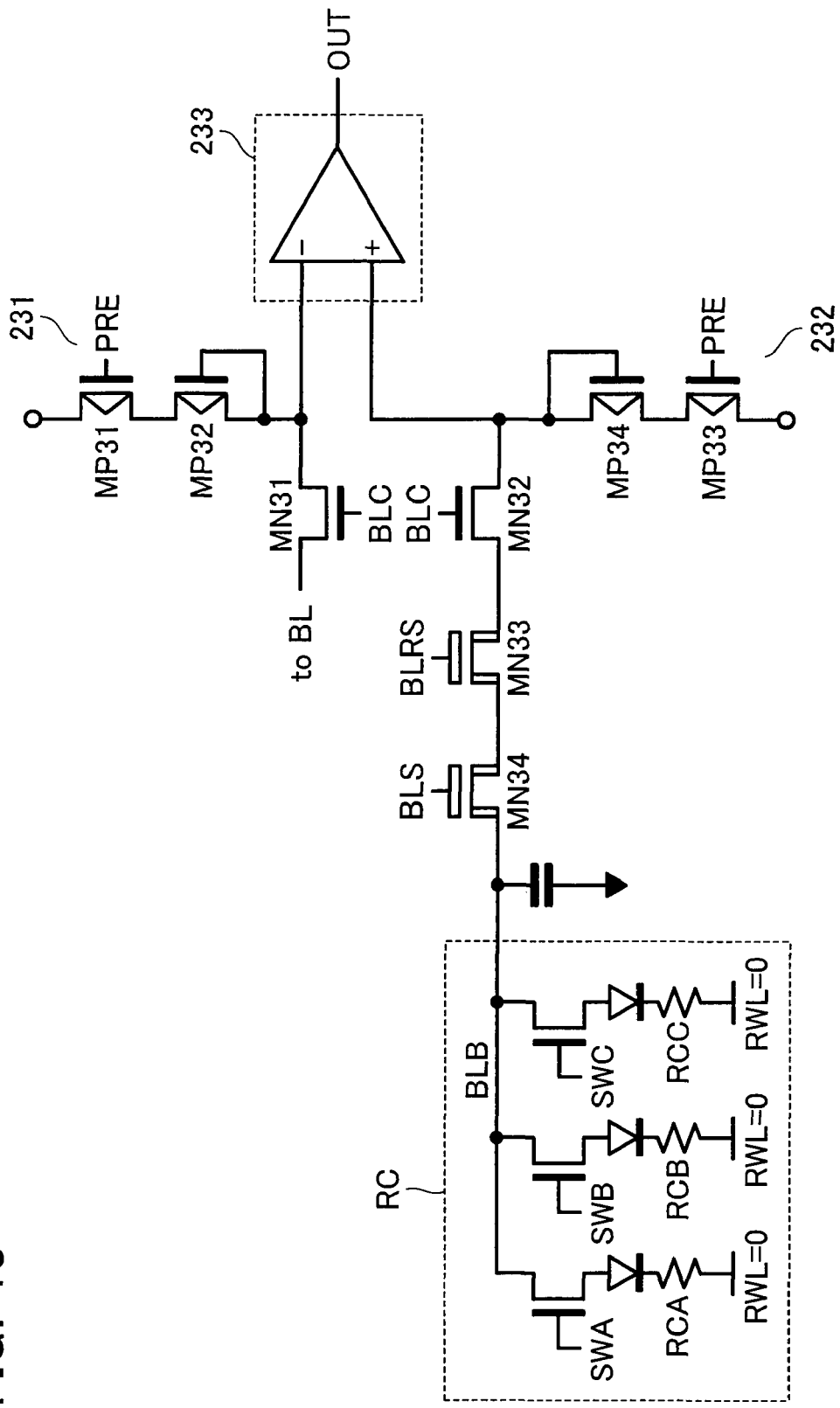
FIG. 13 is a circuit diagram showing a third configuration example of a sense amplifier in the column control circuit.

On the other hand, the read buffer 103 includes a sense amplifier S/A. Available examples of the sense amplifier S/A include various types such as the single-ended type and the differential type that uses a reference cell. FIGS. 11-13 show examples of the sense amplifier S/A.

The sense amplifier S/A of FIG. 11 is a single-ended sense amplifier of the charge transfer type, which is connected via a clamp transistor MN11 to the bit line BL and includes a current source circuit 211 containing a PMOS transistor MP11. The connection node between the PMOS transistor MP11 and the clamp transistor MN11 is a sense node Nsen. The sense node Nsen is connected to one input terminal of a differential amplifier 212. The other input terminal of the differential amplifier 212 is given a reference level VREF.

This sense amplifier S/A precharges the sense node Nsen and senses the variation in voltage on the sense node Nsen, which is amplified on transferring charge corresponding to the current flowing in the memory element. The level on the sense node Nsen can be sensed through comparison with the reference level VREF at the differential amplifier 212.

The sense amplifier S/A of FIG. 12 is a single-ended sense amplifier of the current sense type, of which sense node Nsen connected via a clamp transistor MN21 to the bit line BL is connected to a current source circuit 221 containing PMOS transistors MP21, MP22. The sense node Nsen is connected to one input terminal of a differential amplifier 222. The other input terminal of the differential amplifier 222 is given a reference level VREF.

In this sense amplifier S/A, the gate PRE of the PMOS transistor MP21 becomes L level on reading and the gate bias voltage BIAS to the PMOS transistor MP22 is set at a voltage capable of supplying to the bit line BL a threshold current corresponding to a 1/0 decision threshold or a multivalue data level for the read-intended memory cell.

This sense amplifier S/A senses the potential level on the sense node Nsen elevated by charging the bit line, thereby sensing data. The potential on the sense node Nsen can be determined by the balance between the threshold current of the current source circuit 221 and the sink current in the selected cell. The level on the sense node Nsen can be sensed through comparison with the reference level VREF at the differential amplifier 222.

The sense amplifiers S/A of FIGS. 11 and 12 are single-ended sense amplifiers while the sense amplifier S/A of FIG. 13 is a sense amplifier of the differential type that uses a reference cell. A bit line BL is connected via a clamp transistor NM31 to a PMOS transistor MP32 or a current source load 231, and a reference bit line BLB is connected via a clamp transistor NM32 to a PMOS transistor MP34 or a current source load 232. These load PMOS transistors MP32, MP34 are connected to Vdd via PMOS transistor MP31, MP33 activated with the control signal PRE, respectively.

The clamp transistors NM31, NM32 are produced under the same condition such that they have similar characteristics. Interposed between the clamp transistor NM32 and the reference bit line BLB are selection transistors MN34, MN33, which correspond to the selection transistors MN0, MN4 arranged closer to the bit line BL and have similar characteristics thereto.

The reference bit line BLB is connected to a reference cell RC with three cells RCA, RCB, RCC arranged in parallel, which include variable resistors having different reference resistances written as decision references, and one of these cells is selected with selection signals SWA, SWB, SWC in accordance with the multivalue data level to be decided.

A difference in current between the bit line BL and the bit line BLB is sensed at a differential amplifier 233.

Figure 14:
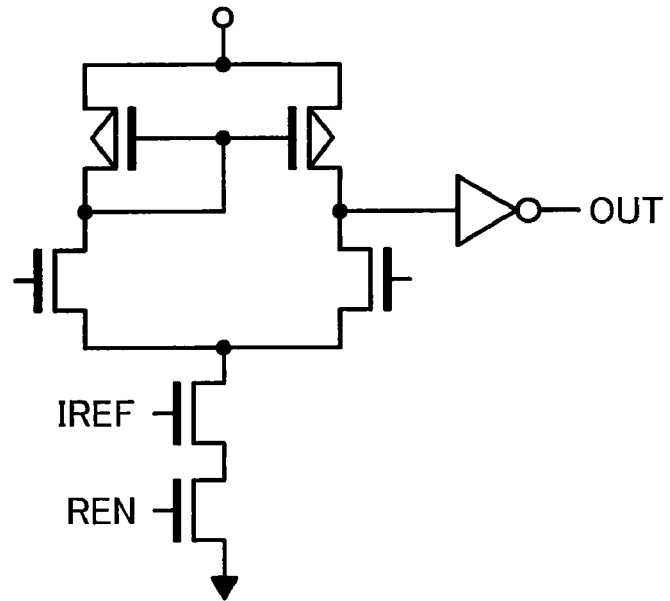
FIG. 14 is a circuit diagram showing a first configuration example of a differential amplifier in FIGS. 11-13.
Figure 15:
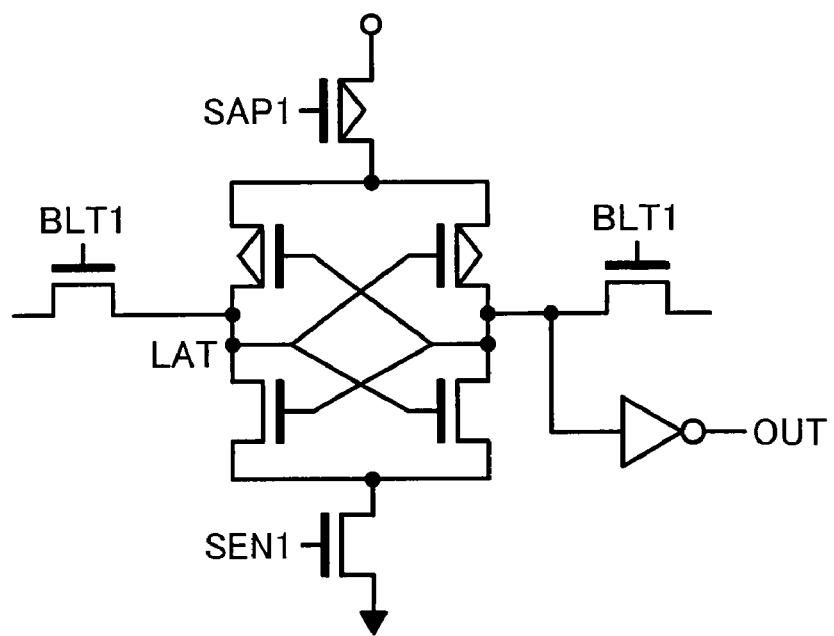
FIG. 15 is a circuit diagram showing a second configuration example of a differential amplifier in FIGS. 11-13.

Available examples of the differential amplifiers 212, 222, 233 in FIGS. 11-13 may include a differential amplifier of the current mirror type shown in FIG. 14 and a differential amplifier of the latch type shown in FIG. 15.

Figure 16:
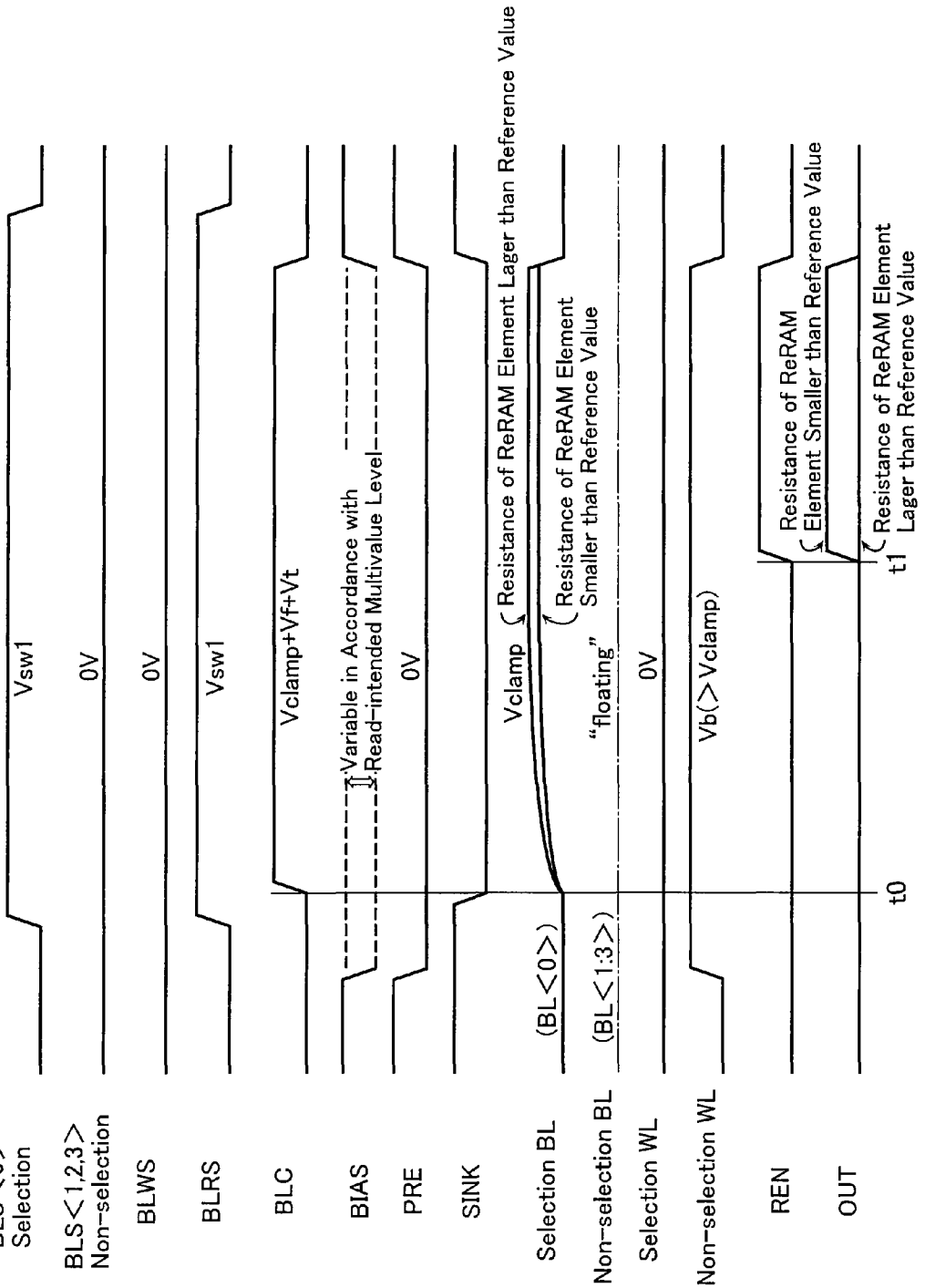
FIG. 16 is a waveform diagram showing data reading in the nonvolatile semiconductor memory according to the same embodiment.

FIG. 16 shows operating voltage waveforms on data reading (normal reading and verify reading) using the sense amplifier S/A of FIG. 12. The power node of the current source circuit 221 is supplied with a read voltage VREAD. The selection transistors MN0 and MN5 for connecting the selected bit line to the sense amplifier are supplied, as signals BLS<0> and BLRS, with a voltage Vsw1, which enables these transistors to transfer at least the assumable highest value of the bit line charged-level Vclamp. The clamp voltage BLC applied to the gate of the clamp transistor MN21 is supplied with Vclamp+Vf+Vt (Vf indicates a voltage drop across a diode SD, and Vt a threshold of an NMOS transistor).

The bias voltage BIAS has a voltage value, which is selected so as to supply the threshold current selected in accordance with read-intended data as described above. Non-selected word lines are supplied with the blocking voltage Vb.

Among necessary selection signals, the clamp voltage BLC finally becomes "H" to start charging the selected bit line (at timing t0). The bit line is charged along the charging curve determined by the sink current in the selected cell and the threshold current of the current source circuit 221. After charging the bit line for certain time, an activation signal REN="H" (if the differential amplifier of FIG. 14 is used) is used to activate the sense amplifier S/A (at timing t1). A comparison with the reference level VREF results in a sense output OUT="L" when the cell resistance is larger than the threshold resistance and OUT="H" when it is smaller.

Figure 17:
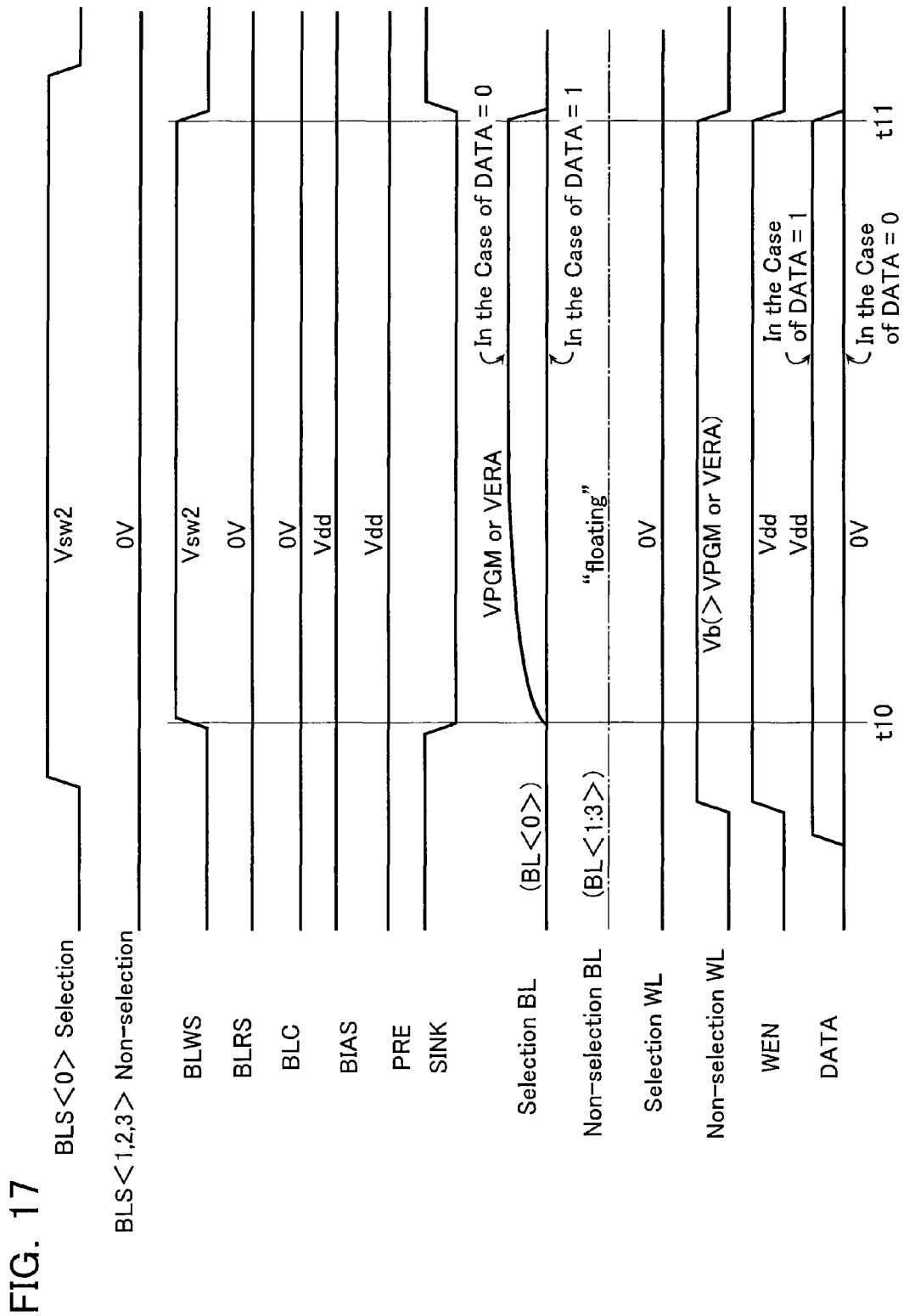
FIG. 17 is a waveform diagram showing data writing in the nonvolatile semiconductor memory according to the same embodiment.

FIG. 17 shows waveforms on setting and resetting by the write buffer 102. In this example, setting is defined as write and resetting as erase, and the selected bit line BL<0> is supplied with the write voltage VPGM or the erase voltage VERA.

The selection signal BLS<0> corresponding to the selected bit line and the selection signal BLWS for connecting the bit line with the write buffer are set at values that enable these signals-applied transistors to transfer at least the write voltage VPGM and the erase voltage VERA.

The write buffer 102 is given data "0" on writing or erasing and data "1" on non-writing or non-erasing and is activated only for the former. It can be activated when the activation signals are set as WEN=Vdd, bWEN=Vss.

Non-selected bit lines are floated and the selected word line is supplied with Vss while non-selected word lines with the blocking voltage Vb (>VPGM, VERA). BLS, BLRS are kept at Vss and BIAS, PRE at Vdd to keep the sense amplifier S/A inactivated and isolated from the bit line.

At timing t10, application of the write voltage VPGM or the erase voltage VERA to the selected bit line is started to execute write or erase in the selected cell with data "0". Timing t11 indicates the timing of terminating write or erase. The difference between the write voltage VPGM and the erase voltage VERA and the difference in voltage application time, t11-t10, between write and erase are not shown herein though the optimal voltage level and time can be set correspondingly.

The following description is given to generation of the clamp voltage BLC on reading.

On reading, application of a voltage of 0.5 V to the part of the variable resistor VR requires application of a voltage, 0.5 V+Vf, to an actual bit line BL, which additionally includes a voltage Vf corresponding to the loss in the diode SD, as described earlier. This bit line voltage is caused by applying the clamp voltage BLC (=Vclamp+Vf+Vt) to the gates of the clamp transistors MN11, MN21, MN31. The clamp voltage is generated at the bit line voltage generator circuit 104 shown in FIG. 10.

Figure 18:
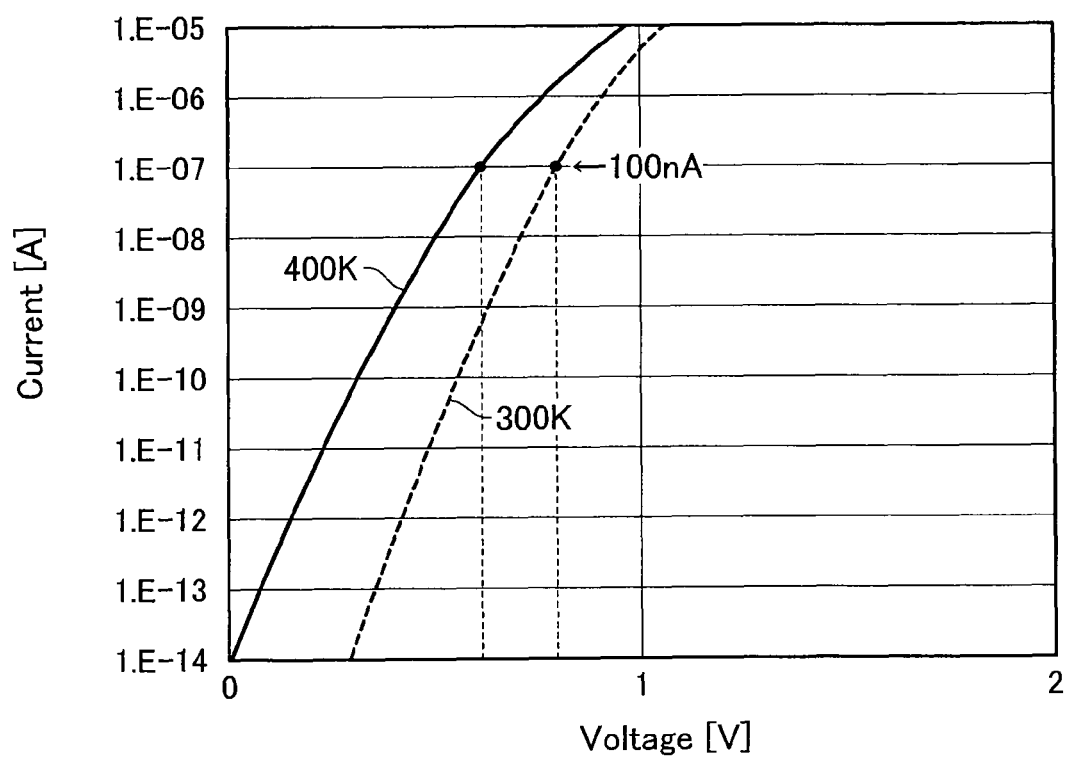
FIG. 18 is a graph showing a temperature characteristic of a diode in the nonvolatile semiconductor memory.

The bit line voltage generator circuit 104 is described below. The electrical characteristic of a diode has temperature dependence as shown in FIG. 18. Accordingly, if the clamp voltage BCL, that is, the bit line voltage has no temperature dependence, then the voltage applied to the variable resistor VR part has temperature dependence instead. Therefore, even in the same variable resistor VR, the current flowing in the variable resistor VR part has temperature dependence and shifts the 1/0 decision point depending on the temperature on sensing, which reduces the sense margin as a problem. If memory cells are stacked three-dimensionally to achieve high integration, the characteristic of the diode may vary from layer to layer. Accordingly, the optimal 1/0 decision point may vary depending on the layer to be selected on sensing.

In the present embodiment, the bit line clamp voltage BLC (that is, the bit line voltage) is given similar temperature dependence to that of the diode SD contained in the memory cell MC to reduce the temperature dependence of the final voltage applied to the variable resistor VR.

Figure 19:
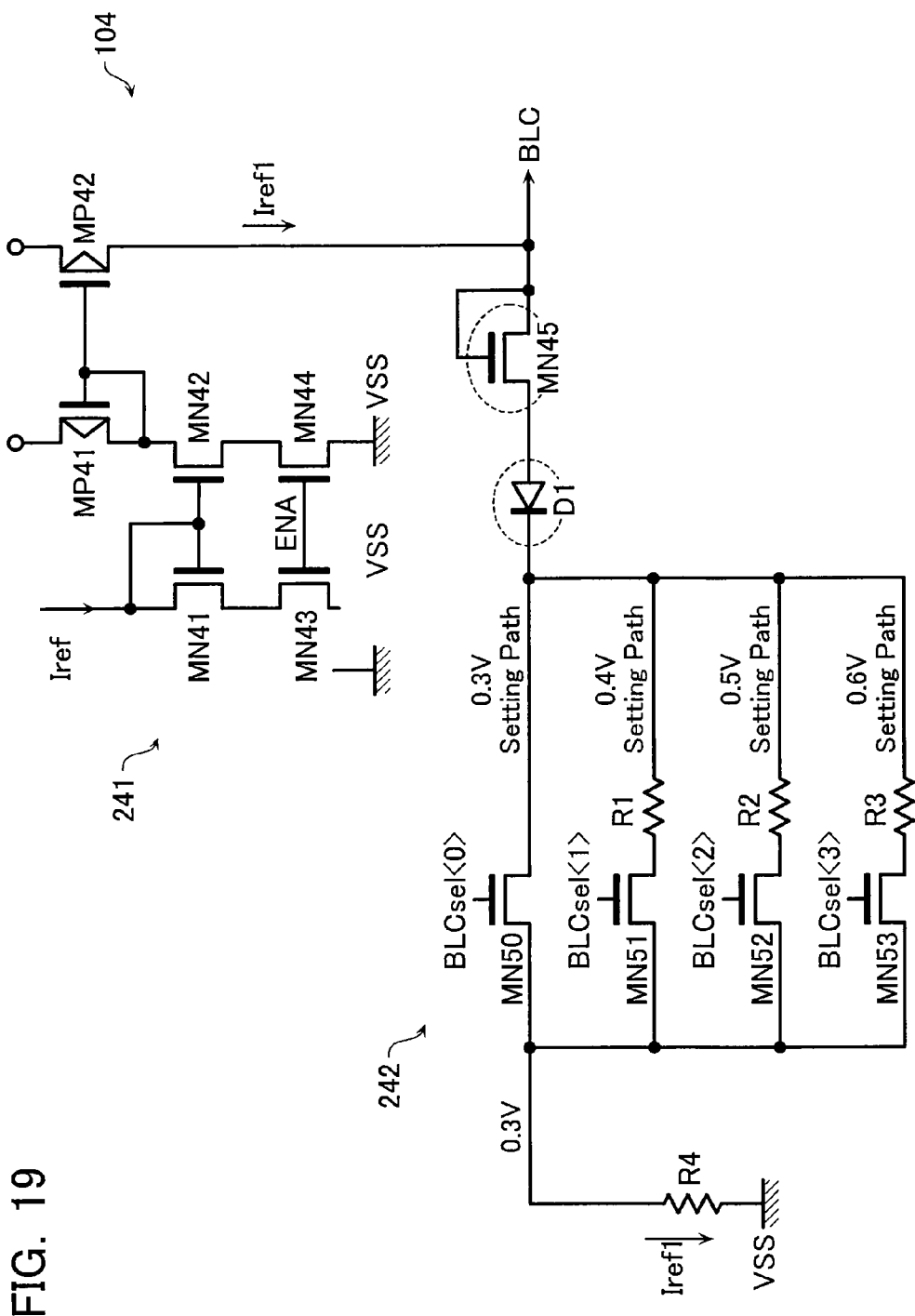
FIG. 19 is a circuit diagram showing a configuration of a bit line clamp voltage generator circuit in a nonvolatile semiconductor memory according to the same embodiment.

FIG. 19 is a circuit diagram showing a configuration example of the bit line clamp voltage generator circuit 104 according to the first embodiment.

The bit line clamp voltage generator circuit 104 includes a constant current circuit 241 operative to supply a constant current Iref1, and a transistor MN45, a second non-ohmic element or diode D1, and a variable resistor circuit 242, which are serially connected in a current path for producing a flow of the constant current Iref1 output from the constant current circuit 241.

The constant current circuit 241 includes transistors MN41, MN42 for configuring a current mirror pair; circuit activation transistors MN43, MN44 serially connected to the above transistors; and transistors MP41, MP42 for configuring a current mirror output circuit operative to receive the output from the current mirror pair and supply the constant current Iref1.

The transistor MN45 is formed to play a role in tracking the threshold of the clamp transistor MN21 (or MN11, MN31) in the sense amplifier S/A and obtain a characteristic similar to that of the clamp transistor MN21. The voltage on the bit line BL on reading is equal to the gate voltage BLC on the clamp transistor MN21 in the sense amplifier S/A minus the threshold. Accordingly, it is diode-connected to form the same structure.

The diode D1 is operative to track the voltage placed on the diode SD in the memory cell MC and is produced under the similar condition to that for the diode SD in the memory cell MC and formed to have the similar characteristic.

The variable resistor circuit 242 has a first path containing a transistor MN50, a second path containing a transistor MN51 and a resistor R1, a third path containing a transistor MN52 and a resistor R2, and a fourth path containing a transistor MN53 and a resistor R3, which are connected in parallel, and this parallel circuit is serially connected to a resistor R4. The transistors MN50-MN53 are selectively turned on to set the bit line clamp voltage BLC. For example, if the resistors R1, R2, R3, R4 have respective resistances of R, 2 R, 3 R, 4 R where 3 R*Iref1=0.3 V, turning on BLCsel<0>, BLCsel<1>, BLCsel<2>, BLCsel<3> can set the potential on the anode of the diode D1 at 0.3 V, 0.4 V, 0.5 V, 0.6 V, respectively. Therefore, this voltage is applied to the variable resistor VR in the memory cell MC.

The bit line clamp voltage generator circuit 104 of the present embodiment uses elements similar to the diode SD contained in the memory cell MC and the clamp transistor such that the temperature dependence and processing dependence of the above elements can be tracked and fed back to the output from the bit line clamp voltage generator circuit 104 or the bit line voltage. Accordingly, temperature-compensated accurate voltage application can be controlled.

The diode D1 and the diode-connected transistor MN 45 connected in series in the bit line clamp voltage generator circuit 104 may be replaced by respective ones connected in parallel. In such the case, the number of those connected in parallel may be a multiple of the unit of current finally flowing in the diode contained in one cell. The parallel connection averages variations among diodes used in the bit line clamp voltage generator circuit and finally provides the bit line clamp voltage BLC with higher accuracy.

SECOND EMBODIMENT

Figure 20:
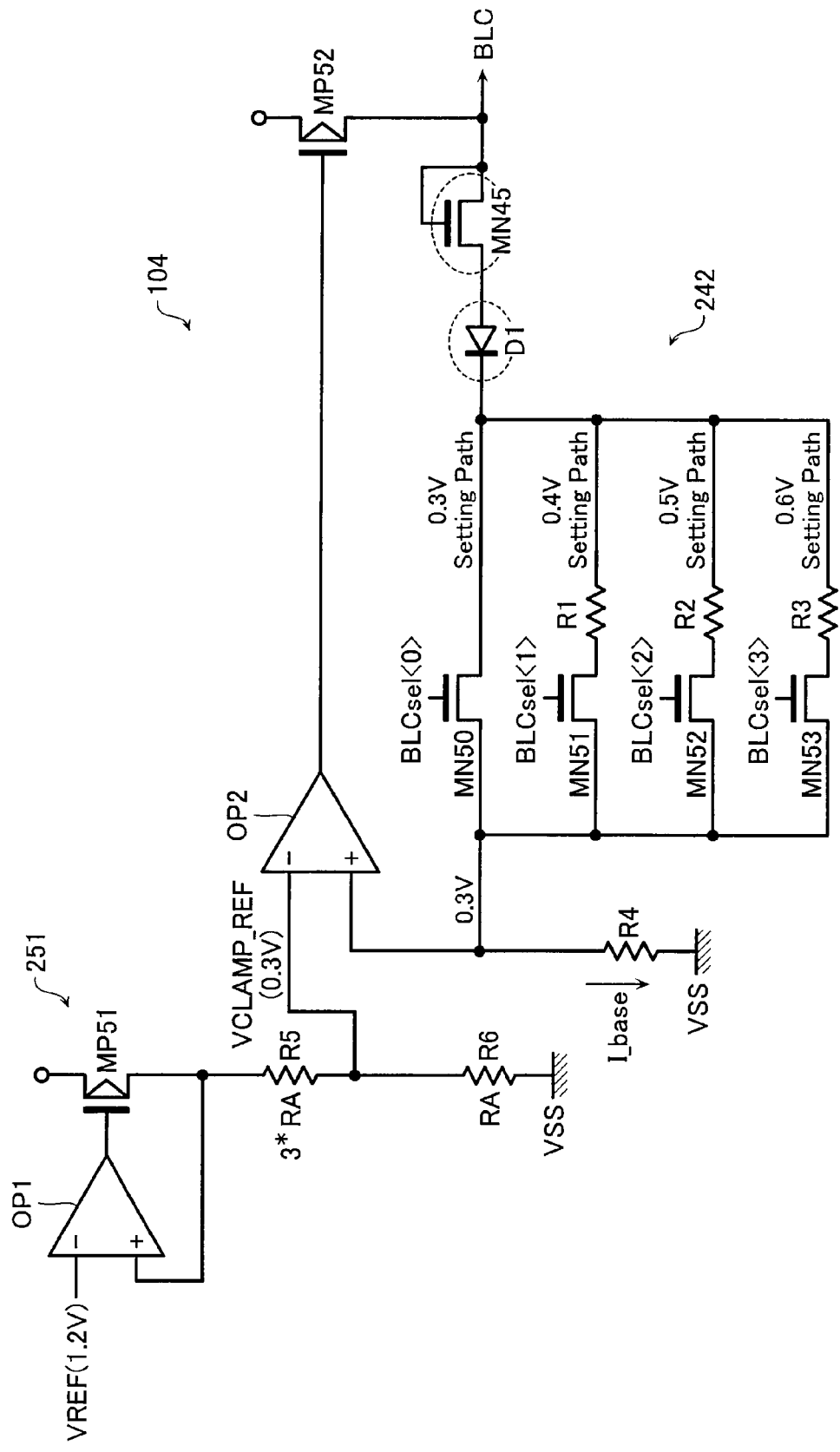
FIG. 20 is a circuit diagram showing a configuration of a bit line clamp voltage generator circuit in a nonvolatile semiconductor memory according to a second embodiment of the present invention.

FIG. 20 is a circuit diagram showing another configuration example of the bit line clamp voltage generator circuit 104.

This bit line clamp voltage generator circuit 104 makes the reference potential in a variable resistor circuit 242 be equal to the reference voltage VCLAMP_REF generated at a constant voltage circuit 251 by controlling the value of current flowing in the transistor MN45, the diode D1 and the variable resistor circuit 242.

The constant voltage circuit 251 includes serially connected resistors R5, R6 having respective resistances of RA, 3*RA, a current source transistor MP51 operative to control the current flowing in the resistors R5, R6, and an operational amplifier OP1 operative to control the current source transistor MP51 based on the reference voltage VREF. The reference voltage VCLAMP_REF output from the constant voltage circuit 251 is fed to the reference terminal of an operational amplifier OP2. The other input terminal of the operational amplifier OP2 is supplied with the reference voltage (the potential caused across the resistor R4) from the variable resistor circuit 242. The output from the operational amplifier OP2 is used to control a transistor MP 52 to control the current flowing in the voltage setting path.

Also with such the circuit, the temperature-compensated bit line clamp voltage can be generated similar to the preceding embodiment.

THIRD EMBODIMENT

Figure 21:
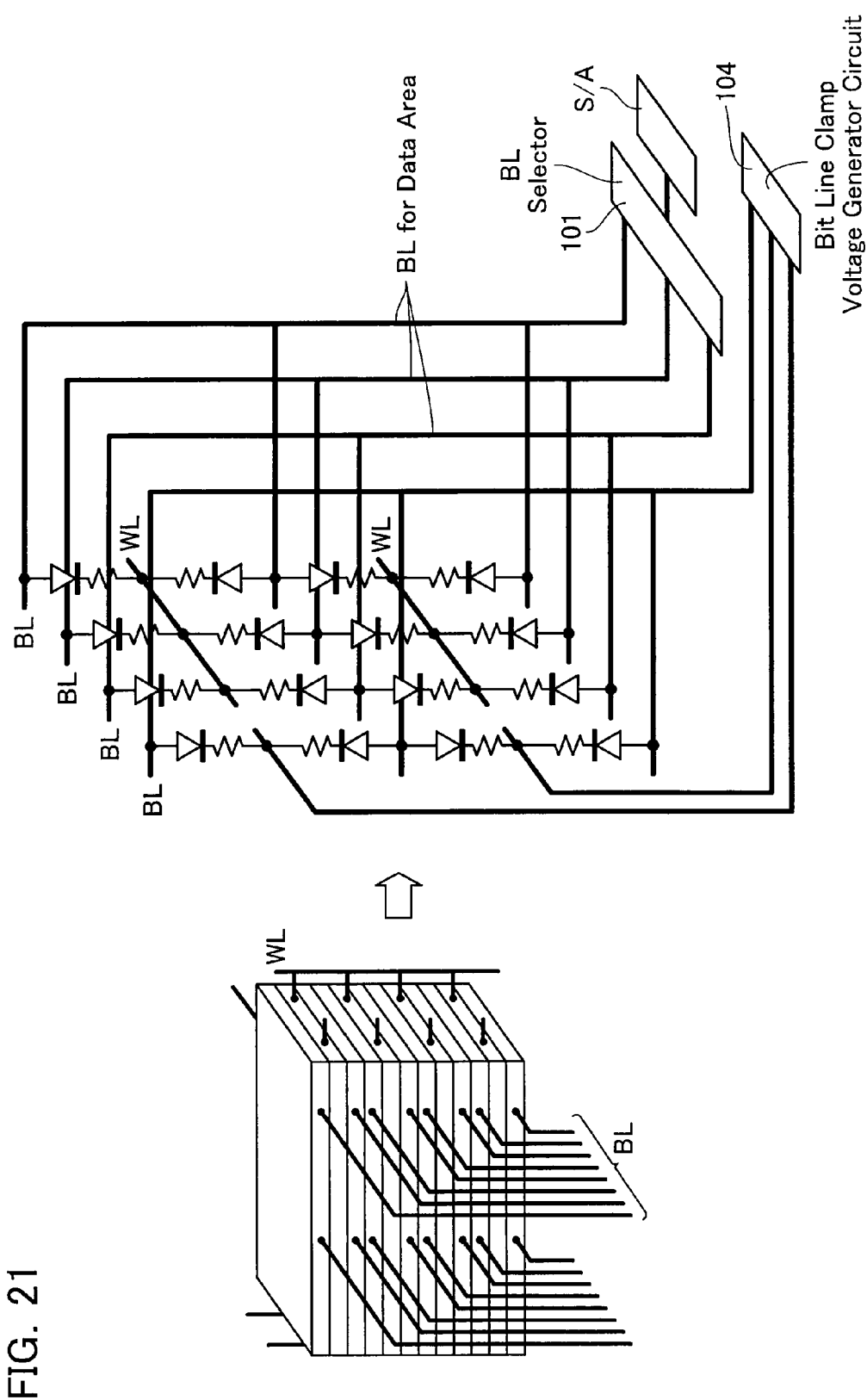
FIG. 21 is a circuit diagram showing a configuration of a bit line clamp voltage generator circuit in a nonvolatile semiconductor memory according to a third embodiment of the present invention.

FIG. 21 is a circuit diagram showing a third embodiment of the present invention. As shown, the memory cells have a multilayered structure. In this case, the diode D1 contained in the bit line clamp voltage generator circuit 104 can be formed in the same layer as that of the temperature-compensated elements formed therein, thereby also allowing it to track the processing dependence of diodes possibly having different characteristics from layer to layer.

OTHER EMBODIMENTS

The present invention is not limited to the above-described embodiments.

For example, the bit line clamp voltage generator circuit may impose temperature dependence on the constant current source itself used therein, as can be considered.

If data is sensed at the word line side, the clamp voltage generator circuit is provided closer to the row control circuit 3.

What is claimed is:

1. A nonvolatile semiconductor memory device, comprising:
    a memory cell array including first and second mutually crossing lines and electrically erasable programmable memory cells arranged at intersections of said first and second lines, each memory cell containing a variable resistor operative to nonvolatilely store the resistance thereof as data and a first non-ohmic element operative to switch said variable resistor;
    a column control circuit operative to, during data read from said memory cell, select a certain at least one of said second lines and charge the selected second line to a certain charged-level; and
    a row control circuit operative to, during data read from said memory cell, select a certain at least one of said first lines, supply to the selected first line a certain selected first line voltage, and supply to unselected first lines a blocking voltage higher than said charged-level and said selected first line voltage,
    wherein said column control circuit changes a clamp voltage for limiting said charged-level in response to a temperature.

2. The nonvolatile semiconductor memory device according to claim 1, wherein said column control circuit changes said clamp voltage to compensate for the temperature characteristic of said first non-ohmic element.

3. The nonvolatile semiconductor memory device according to claim 1, wherein said column control circuit includes a sense amplifier connected to said second line via a clamp transistor having a gate supplied with said clamp voltage and operative to read out data from said memory cell.

4. The nonvolatile semiconductor memory device according to claim 3, wherein said clamp voltage is a voltage which enables said clamp transistor to transfer at least an assumable highest value of said charged-level.

5. The nonvolatile semiconductor memory device according to claim 3,
    wherein said sense amplifier includes a current source circuit connected to said clamp transistor via a sense node, and
    said current source circuit includes a transistor connected to said clamp transistor via said sense node.

6. The nonvolatile semiconductor memory device according to claim 1,
    wherein said column control circuit includes a clamp voltage generator circuit operative to generate said clamp voltage.

7. The nonvolatile semiconductor memory device according to claim 5, wherein said transistor of said current source circuit includes a gate supplied with a bias voltage which changes according to data to be read out.

8. The nonvolatile semiconductor memory device according to claim 7,
wherein, during said data read and after said bias voltage is supplied to said transistor of said current source circuit, said clamp voltage is supplied to said clamp transistor.

9. The nonvolatile semiconductor memory device according to claim 3,
wherein, during data read from said memory cell and after said selected first line voltage is supplied to said selected first line and said blocking voltage is supplied to said unselected first lines, said clamp voltage is supplied to said clamp transistor.

10. The nonvolatile semiconductor memory device according to claim 7,
wherein, during data read from said memory cell and after said selected first line voltage is supplied to said selected first line and said blocking voltage is supplied to said unselected first lines, said clamp voltage is supplied to said clamp transistor.

11. The nonvolatile semiconductor memory device according to claim 10,
wherein, after said bias voltage is supplied to said transistor of said current source circuit, said clamp voltage is supplied to said clamp transistor.

12. The nonvolatile semiconductor memory device according to claim 3,
wherein said column control circuit, during data read from said memory cell, sets unselected second lines to a floating state.

13. The nonvolatile semiconductor memory device according to claim 7,
wherein said column control circuit, during data read from said memory cell, sets unselected second lines to a floating state.

14. The nonvolatile semiconductor memory device according to claim 12,
wherein, during data read from said memory cell and after said selected first line voltage is supplied to said selected first line and said blocking voltage is supplied to said unselected first lines, said clamp voltage is supplied to said clamp transistor.

15. The nonvolatile semiconductor memory device according to claim 13,
wherein, during data read from said memory cell and after said selected first line voltage is supplied to said selected first line and said blocking voltage is supplied to said unselected first lines, said clamp voltage is supplied to said clamp transistor.

16. The nonvolatile semiconductor memory device according to claim 15,
wherein, after said bias voltage is supplied to said transistor of said current source circuit, said clamp voltage is supplied to said clamp transistor.

* * * * *